(12) United States Patent
Von Herzen (10) Patent No.: US 7,501,341 B1
(45) Date of Patent: Mar. 10, 2009

(54) INTERCONNECT ARRAY FORMED AT LEAST IN PART WITH REPEATED APPLICATION OF AN INTERCONNECT PATTERN

(75) Inventor: Brian Von Herzen, Carson City, NV (US)

(73) Assignee: Xilinx, Inc., San Jose, CA (US)

( * ) Notice: Subject to any disclaimer, the term of this patent is extended or adjusted under 35 U.S.C. 154(b) by 141 days.

(21) Appl. No.: 11/123,526

(22) Filed: May 5, 2005

(51) Int. Cl.
   *H01L 21/44* (2006.01)
(52) U.S. Cl. ............................. 438/666; 257/786
(58) Field of Classification Search .............. 438/129, 438/666; 257/786
   See application file for complete search history.

(56) References Cited

U.S. PATENT DOCUMENTS

| | | | |
|---|---|---|---|
| 5,640,048 A * | 6/1997 | Selna | 257/738 |
| 5,691,949 A | 11/1997 | Hively et al. | |
| 5,817,533 A | 10/1998 | Sen et al. | |
| 5,883,525 A | 3/1999 | Tavana et al. | |
| 6,175,158 B1 | 1/2001 | Degani et al. | |
| 6,396,136 B2 | 5/2002 | Kalidas et al. | |
| 6,567,969 B1 | 5/2003 | Agrawal et al. | |
| 6,738,279 B1 | 5/2004 | Kablanian | |
| 6,762,366 B1 * | 7/2004 | Miller et al. | 174/250 |
| 6,875,921 B1 | 4/2005 | Conn | |
| 7,095,107 B2 * | 8/2006 | Ramakrishnan et al. | 257/691 |
| 7,122,751 B1 | 10/2006 | Anderson et al. | |
| 7,138,820 B2 | 11/2006 | Goetting et al. | |
| 7,233,168 B1 | 6/2007 | Simkins | |
| 7,239,173 B1 | 7/2007 | Voogel | |
| 7,345,507 B1 | 3/2008 | Young et al. | |

OTHER PUBLICATIONS

Richard L. Wheeler of Wheeler Enterprises; "Switching Noise in VLSI Packages"; Mar. 12, 1997; downloaded from http://www.wheeler.com/technology/visipresentation1/index.htm (1 of 2) [Dec. 17, 2001 6:11:28 PM]; downloaded on May 4, 2005.
Richard L. Wheeler of Wheeler Enterprises; "Modeling Simultaneous Switching Noise (SSO) in the Z-axis Direction of VLSI Packages and PCB's"; Nov. 9, 1999; downloaded from http://www.wheeler.com/technology/visipresentation2/sld002.htm (1 of 2) [Dec. 17, 2001 6:13:17 PM]; downloaded on May 4, 2005.
U.S. Appl. No. 11/352,035, filed Feb. 10, 2006; Wu, Paul Ying-Fung et al., "Interconnect Pattern for Semiconductor Packaging", 25 pages, available from Xilinx, Inc., 2100 Logic Drive, San Jose, CA 95124.

\* cited by examiner

*Primary Examiner*—Thao X Le
*Assistant Examiner*—A. K. A.
(74) *Attorney, Agent, or Firm*—W. Eric Webostad (57) ABSTRACT

An interconnect array formed at least in part using repeated application of an interconnect pattern is described. The interconnect pattern has at least ten interconnect locations. One of the ten interconnect locations is for a power interconnect. Another one of the ten interconnect locations is for a ground interconnect. At least eight interconnect locations remaining are for additional interconnects. The at least eight remaining interconnect locations disposed around a medial region, where either the ground interconnect or the power interconnect is located in the medial region. An offset region having the one of either the ground interconnect or the power interconnect not in the medial region. The interconnect array is at least partially formed by repeated application of the interconnect pattern off-set from one another responsive to the offset region.

9 Claims, 10 Drawing Sheets

FIG. 7

INTERCONNECT ARRAY FORMED AT LEAST IN PART WITH REPEATED APPLICATION OF AN INTERCONNECT PATTERN

FIELD OF THE INVENTION

One or more aspects of the invention relate generally to interconnects and, more particularly, to an interconnect array formed at least in part using a repeated application of an interconnect pattern.

BACKGROUND OF THE INVENTION

As integrated circuits have become more complex employing more and more pins in a limited area, mutual inductance between pins has increased. In fact, a complex integrated circuit die is conventionally coupled to a significantly larger package to couple such integrated circuit die to a printed circuit board ("PCB"), as the pin density of such die may be too great to directly couple the die to the PCB.

To address mutual inductance, as well as self-inductance, in interconnect arrays and other interconnect topologies, others have suggested using patterns to lay out such interconnect arrays. One type of pattern known as a checkerboard pattern conventionally alternates power and ground pins to reduce mutual inductance; however, the checkerboard pattern leaves no pins for signals.

Accordingly, it would be desirable and useful to provide a pinout with sufficiently low mutual inductance, but with increased signal pin density over that of a checkerboard pattern.

SUMMARY OF THE INVENTION

One or more aspects of the invention relate generally to interconnects and, more particularly, to an interconnect array formed at least in part using a repeated application of an interconnect pattern.

An aspect of the invention is a method for providing an interconnect array pattern, including: obtaining an interconnect pattern; and repeatedly applying the interconnect pattern to provide at least a portion of the interconnect array pattern. The interconnect pattern has at least ten interconnect locations, where one of the at least ten interconnect locations is for a power interconnect, another one of the at least ten interconnect locations is for a ground interconnect, and at least eight remaining interconnect locations of the at least ten interconnect locations are for additional interconnects to provide at least eight additional interconnects. One of either the ground interconnect or the power interconnect is located in a medial region of the interconnect pattern. The interconnect pattern includes: a first two of the at least eight remaining interconnect locations located horizontally adjacent to the medial region, where one of the first two is located on a right side of the medial region and another one of the first two is located on a left side of the medial region; and a second two of the at least eight remaining interconnect locations located vertically adjacent to the medial region, where one of the second two is located on a top side of the medial region, another one of the second two is located on a bottom side of the medial region. An offset region of the at least ten interconnect locations is located diagonally adjacent to one of either the first two or the second two of the at least eight remaining interconnect locations, where the offset region is external to a perimeter defined by the at least eight remaining interconnect locations. The one of either the power interconnect or the ground interconnect that is not located in the medial region is located in the offset region.

Another aspect of the invention is an interconnect array including an interconnect pattern. The interconnect pattern has at least ten interconnect locations, where one of the at least ten interconnect locations is for a power interconnect, another one of the at least ten interconnect locations is for a ground interconnect, and at least eight remaining interconnect locations of the at least ten interconnect locations are additional interconnects to provide at least eight additional interconnects. One of either the power interconnect or the ground interconnect is located in a medial region of the interconnect pattern. A first two of the at least eight additional interconnect locations are located horizontally adjacent to the medial region, where one of the first two is located on a right side of the medial region, and another one of the first two is located on a left side of the medial region. A second two of the at least eight additional interconnect locations are located vertically adjacent to the medial region, where one of the second two is located on a top side of the medial region, and another one of the second two is located on a bottom side of the medial region. An offset region of the at least ten interconnect locations is located either horizontally or vertically adjacent to one of either the first two or the second two of the at least eight additional interconnect locations, where the offset region being external to a perimeter defined by the at least eight additional interconnect locations. The one of either the power interconnect or the ground interconnect that is not located in the medial region is located in the offset region.

Yet another aspect of the invention is an interconnect array including a first interconnect pattern. The first interconnect pattern has ten first interconnect locations, where one of the first interconnect locations is for a power interconnect, another one of the first interconnect locations is for a ground interconnect, and eight of the ten first interconnect locations remaining are for additional interconnects. One of either the power interconnect or the ground interconnect is located in a medial region of the first interconnect pattern. A first two of the eight of the ten first interconnect locations are located diagonally adjacent to and above the medial region. A second two of the eight of the ten first interconnect locations are located diagonally adjacent to and below the medial region. An offset region of the ten first interconnect locations is located either horizontally or vertically adjacent to one of either the first two or the second two of the eight of the ten first interconnect locations. The offset region is external to a perimeter defined by the eight of the ten first interconnect locations. The one of either the power interconnect or the ground interconnect that is not located in the medial region is located in the offset region.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different.

There are many types of complex integrated circuits for which mutual inductance may be closely linked with pin density. General categories of these complex integrated circuits may include system-on-chip, processors, application specific integrated circuits, and application specific standard products, among others. The terms "include" and "including" as used herein mean including without limitation. Examples of such integrated circuits include microprocessors, digital signal processors, communication integrated circuits including framers and cross-connects, programmable logic devices, memories, and graphic signal processors. One type of complex programmable logic device integrated circuit is a Field Programmable Gate Array ("FPGA").

Figure 1A:
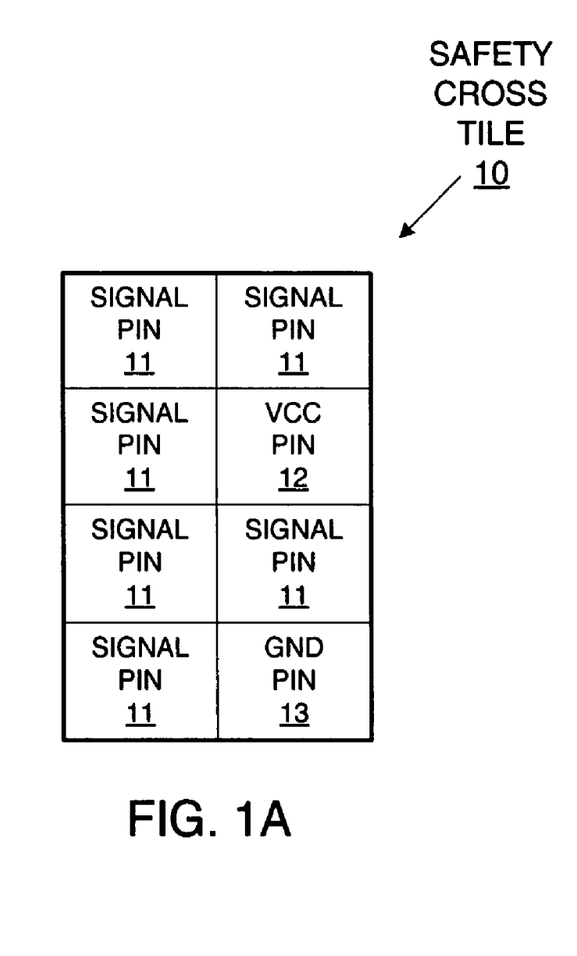
FIG. 1A is a block layout diagram depicting an exemplary embodiment of a tile.
Figure 1B:
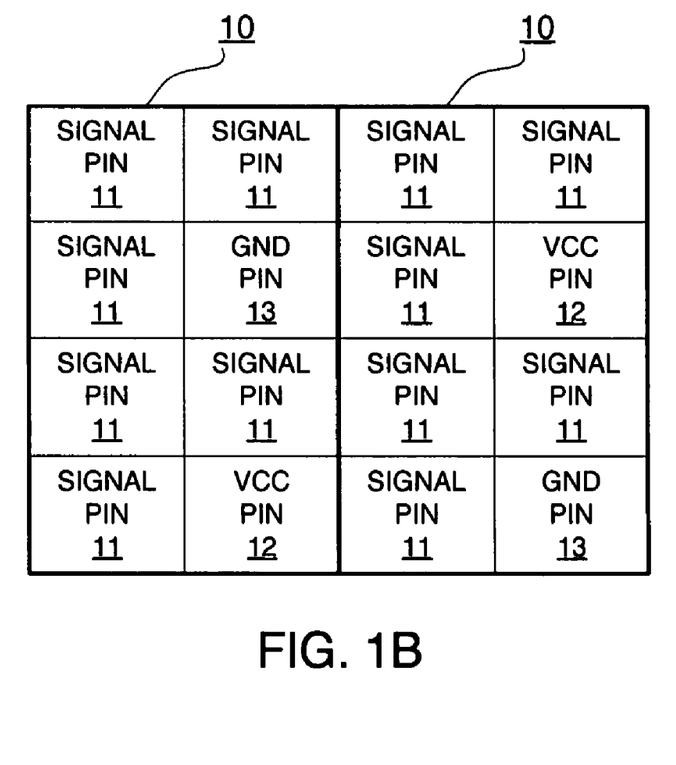
FIG. 1B is a block layout diagram of with two tiles of FIG. 1A adjacent to one another with power and ground pin locations swapped.

To achieve high signal pin density and low mutual inductance, others have suggested using a signal-to-power-to-ground pinout ratio of 6:1:1. FIG. 1A is a block layout diagram depicting an exemplary embodiment of a 6:1:1 ratio tile 10. Tile 10 has four signal pins 11 vertically adjacent to one another in one column, and in an adjacent column there are two signal pins 11, one Vcc pin 12 and one ground pin 13. In the adjacent column, a signal pin 11 is interposed between the Vcc pin 12 and the ground pin 13. Thus, with repeated application of tile 10, a signal pin 11 is interleaved between a Vcc pin 12 and a ground pin 13, though position of ground pin 13 and Vcc pin 12 is swapped, as illustratively shown in the block layout diagram of FIG. 1B with two tiles 10 adjacent to one another. Notably, both tiles 10 in FIG. 1B in combination may be considered a tile. The 6:1:1 tile has a low mutual inductance owing to each signal pin being no more than one pin away from a power pin and a ground pin. Unfortunately, in order to limit mutual inductance, tile 10 sacrifices too much signal density. Moreover, the 6:1:1 tile seeks to limit mutual inductance too far beyond a sufficiently low level.

Figure 2A:
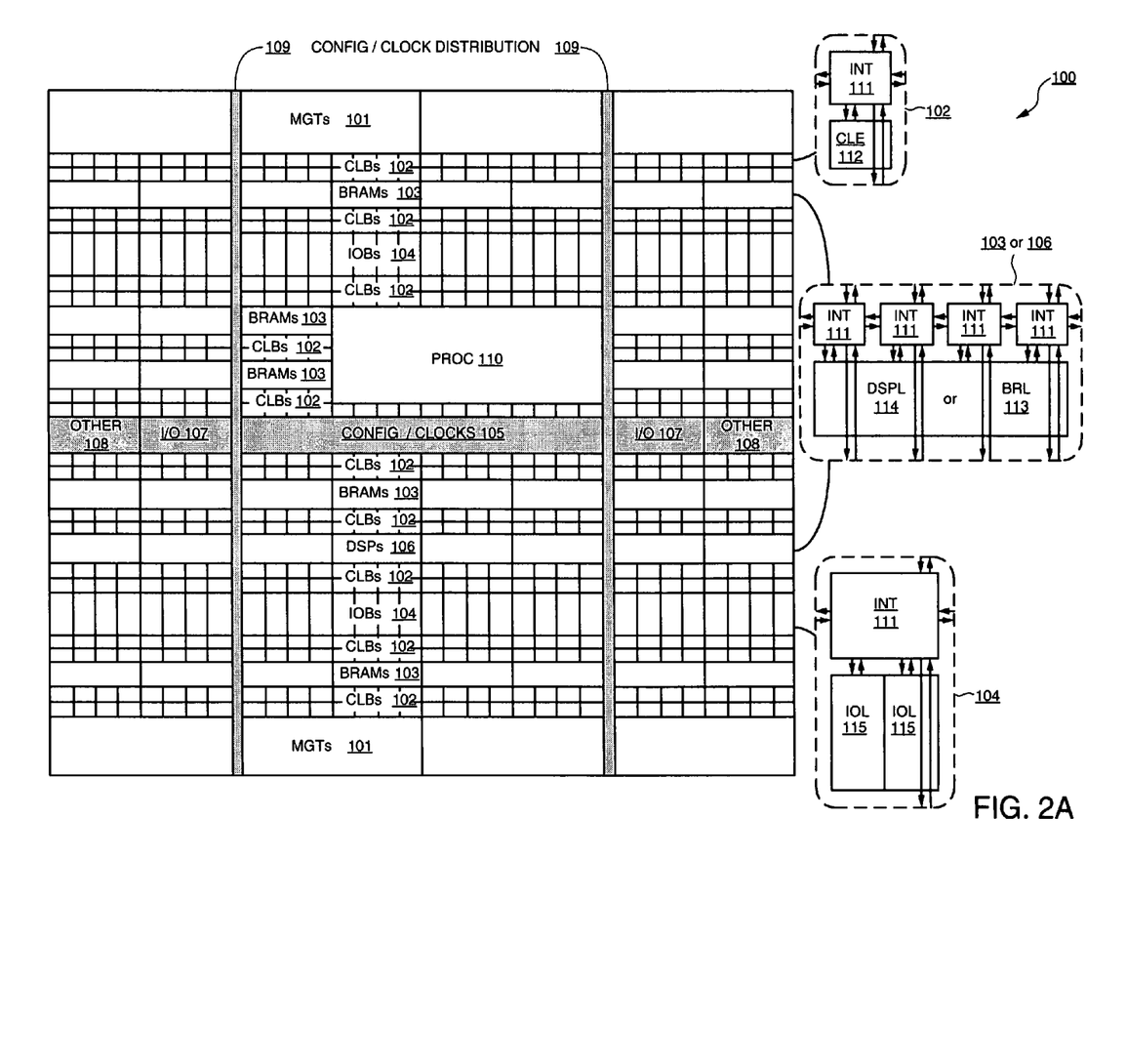
FIG. 2A is a simplified block diagram depicting an exemplary embodiment of a columnar Field Programmable Gate Array ("FPGA") architecture in which one or more aspects of the invention may be implemented.

FIG. 2A illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 2A.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 2A.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 2A) is used for configuration, I/O, clock, and other control logic. Vertical areas 109 extending from this column are used to distribute the clocks and configuration signals across the breadth of the FPGA.

Some FPGAs utilizing the architecture illustrated in FIG. 2A include additional logic blocks that disrupt the regular columnar structure making up a large part of the FPGA. The additional logic blocks can be programmable blocks and/or dedicated logic. For example, the processor block 110 shown in FIG. 2A spans several columns of CLBs and BRAMs.

Note that FIG. 2A is intended to illustrate only an exemplary FPGA architecture. The numbers of logic blocks in a column, the relative widths of the columns, the number and order of columns, the types of logic blocks included in the columns, the relative sizes of the logic blocks, and the interconnect logic implementations included at the right side of FIG. 2A are purely exemplary. For example, in an actual FPGA more than one adjacent column of CLBs is typically included wherever the CLBs appear, to facilitate the efficient implementation of user logic.

FPGA 100 may be a Virtex-4™ FPGA from Xilinx of San Jose, Calif. FPGA 100 may have a pinout formed at least in part by repeated application of an interconnect pattern as described below herein in additional detail.

Figure 2B:
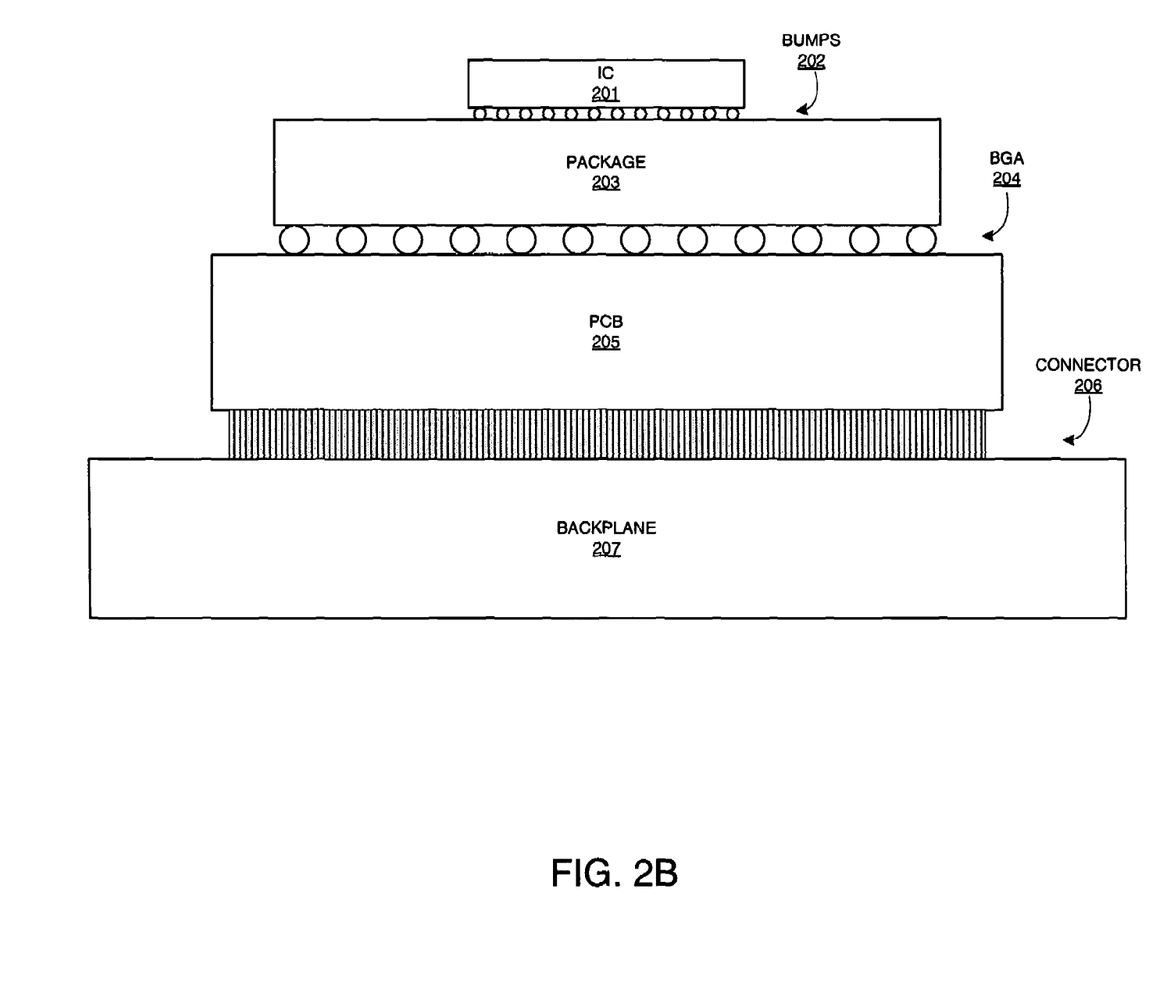
FIG. 2B is a high-level side view depicting an exemplary embodiment of an integrated circuit ("IC") 201 coupled to a printed circuit board.

FIG. 2B is a high-level side view depicting an exemplary embodiment of an integrated circuit ("IC") 201 coupled to a printed circuit board ("PCB") 205. IC 201 may be FPGA 100 of FIG. 2A or other known complex IC. Although FIG. 2B specifically identifies different types of interconnect arrays, such as solder bumps 202, ball grid array ("BGA") 204 and connector 206, it should be understood that any one of these types of interconnect arrays, or any combination of two or more of these interconnect arrays, may be formed in whole or in part using repeated application of an interconnect pattern as described herein.

IC 201 is coupled to package 203 via solder bumps 202. Solder bumps 202 may be configured or otherwise laid out using repeated application of an interconnect pattern. More particularly, in an embodiment an asymmetric tile may be used to provide a layout of interconnect locations, as described below in additional detail. By asymmetric tile, it is meant that perimeter of the tile is irregular, though two symmetrical tiles may be used to form the perimeter of the asymmetric tile. In the example below, a 3×3 tile and a 1×1 tile in combination form the asymmetric tile and thus the perimeter of the asymmetric tile. Package 203, which may be made of an organic or inorganic material as is known, is coupled to PCB 205 via BGA 204. BGA 204 may be a fine-pitch BGA. BGA 204 may be laid out in accordance with tiling with a tile, as described herein below in additional detail. PCB 205 may be a line card or daughter card coupled to a backplane, motherboard, or other larger PCB 207 via connector topology 206. Connector topology 206 may be configured using one or more tiles as described below herein in additional detail. Moreover, it should be appreciated that a multi-chip module can be coupled to a PCB using one or more tiles for connector topology. Furthermore, a PCB-to-mezzanine card application may be coupled using a connector topology having one or more tiles.

Though the above description with reference to FIG. 2B has been in terms of solder bumps 202, BGA 204, and connector topology 206, it should be understood that a tile as described herein may be used with other types of connectors for communicating information. Examples of other types of connectors include optical connectors. Moreover, it should be appreciated that although a tile as described herein is used with flip-chip technology, a wirebond or other known interconnect technology may be used. Furthermore, although an example of a BGA is used, it should be understood that other connector technologies, including land grid array ("LGA") and column grid array ("CGA"), among other known connector technologies, may be used.

Figure 3A:
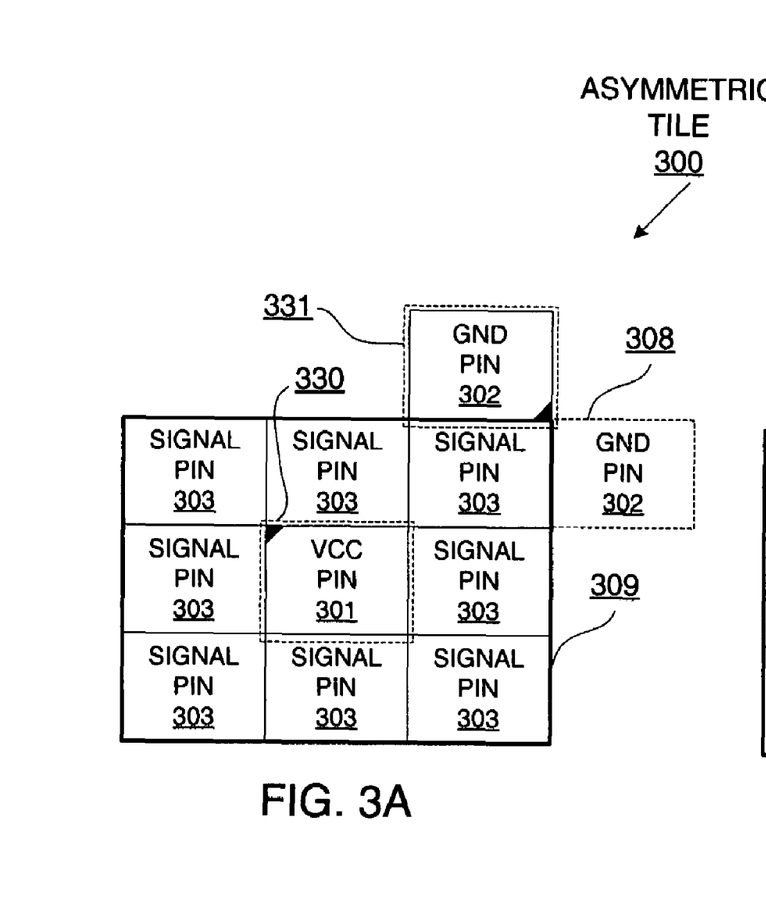
FIG. 3A is a block layout diagram depicting an exemplary embodiment of a tile.

FIG. 3A is a block layout diagram depicting an exemplary embodiment of a tile 300. In this embodiment, tile 300 is an asymmetric tile, which in this exemplary embodiment includes a power connectivity location 301 surrounded by eight signal connectivity locations 303 and having a ground connectivity location external to the eight signal connectivity locations 303. However, alternatively in another embodiment, another connectivity location may be added to another offset region of tile 300 to make it a symmetric tile. Power connectivity location 301 is generally in a middle region 330 with respect to signal connectivity locations 303. A ground connectivity location 302 is generally in an offset region 331 external and adjacent to a perimeter of array 309, or more particularly to a perimeter of eight signal connectivity locations 303. For purposes of clarity by way of example and not limitation, these connectivity locations shall be hereinafter referred to as "pins." Moreover, by way of example and not limitation, a power pin 301 shall be referred to as a "Vcc pin 301". In this particular example, Vcc pin 301 may be a Vcc out pin.

As mentioned above, connectors other than pins may be laid out in accordance with one or more of tiles 300. Furthermore, the power level need not be a Vcc power level, as other known power levels may be used. Notably, tile 300 may be considered a tile that is capable of tiling a plane area, which may be applied where one tile is offset from another tile for repeated application to tile an area. Notably, there may be boundary conditions for a finite plane, where the interconnect pattern of tile 300 is not maintained or is truncated, as described below in additional detail.

Pins 303 surround pin 301 forming an array 309, which is a portion of tile 300. Array 309, for purposes of clarity by way of example and not limitation, may be thought of as a square or a rectangle. An additional pin, such as a ground pin 302, is part of tile 300 and is located adjacent to, though external to, array 309. Ground pin 302 may be located at any of eight possible locations around the square or rectangle formed by pins 301 and 303. More particularly, ground pin 302 may be located adjacent to any of the corner signal pins 303 of array 309. For example, an alternative location of ground pin 302 is illustratively shown with a dashed box 308 in FIG. 3A. Thus, in this example, a complete tile 300 consists of 10 pins, and such tile 300 has a pattern associated with the location of a power pin to signal pins and with the location of a ground pin to corner signal pins. Tile 300 in this example has a signal-to-power-to-ground ratio of eight-to-one-to-one ("8:1:1").

Tile 300 when put together with other such tiles 300 may be used to fill a plane to provide a pinout array, or at least a portion thereof. Thus, for example, one tile 300 may be offset down and over from another tile 300 for filling a plane.

Notably, ground pin 302 and Vcc pin 301 may be swapped such that ground pin 302 is the pin about which array 309 is centered, and Vcc pin 301 is located adjacent a corner pin of array 309 at one of eight possible locations to form an interconnect pattern or tile. However, for purposes of clarity by way of example and not limitation, it shall be assumed that ground pin 302 is the external pin to array 309 of tile 300. As will become more apparent from the description that follows, laying out a pinout array using tiles, the ratio of 8:1:1 for signal-to-power-to-ground may be maintained in an example layout or portion thereof. Moreover, eight nearest neighbors of each Vcc pin 301 and each ground pin 302, when multiple tiles 300 are used, may be signal pins 303, as shall become more apparent from the description that follows.

By maintaining an 8:1:1 ratio, mutual inductance of signal pins 303 proximate to Vcc pin 301 and ground pin 302 may be maintained at or below a threshold value, sometimes referred to as a worst-case value. Notably, the percentage of decrease in mutual induction from a nominal value for an array scales according to pitch of the array. Though there are many more refined equations for determining mutual inductance ("MI"), a first order approximation may be obtained from Equation (1):

$$MI = L * h^2 / (s^2 + h^2) \tag{1}$$

where s is the distance between pins, h is the distance to a ground plane, and L is self-inductance. For simplicity, h may be assumed to be the distance to a ground pin. By using tile 300, mutual inductance to ground pin 302 and Vcc pin 301 from signal pins may be reduced. For example, if all signals in a bank transition to either a logic high or logic low level on the same clock cycle, then such reduction in mutual inductance may be approximately one half that of a traditional FPGA pinout array architecture for each signal pin 303 that is several millimeters away from a ground pin 302.

Thus, by keeping signal pins 303 generally within one pin distance of a ground pin 302 or a Vcc pin 301, stability may be enhanced. For example, simultaneous switching noise ("SSN") may be reduced in comparison to a traditional FPGA pinout array architecture. More particularly, distance of signal pins from ground pin 302 and Vcc pin 301 may be controlled with tiling to reduce ground bounce and Vcc bounce due to simultaneous switching events. Simultaneous switching events, and more particularly a subset of SSN, includes simultaneous switching output ("SSO").

Notably, the base pattern of tile 300 may be altered for pinout array dimensions and boundary conditions. Moreover, Vcc pin 301 may be replaced with an auxiliary power pin or a Vcc internal power pin. For example, with respect to an auxiliary power pin 301 in close proximity to ground 302 owing to use of tile 300, power supply mutual inductance may be reduced.

Figure 3B:
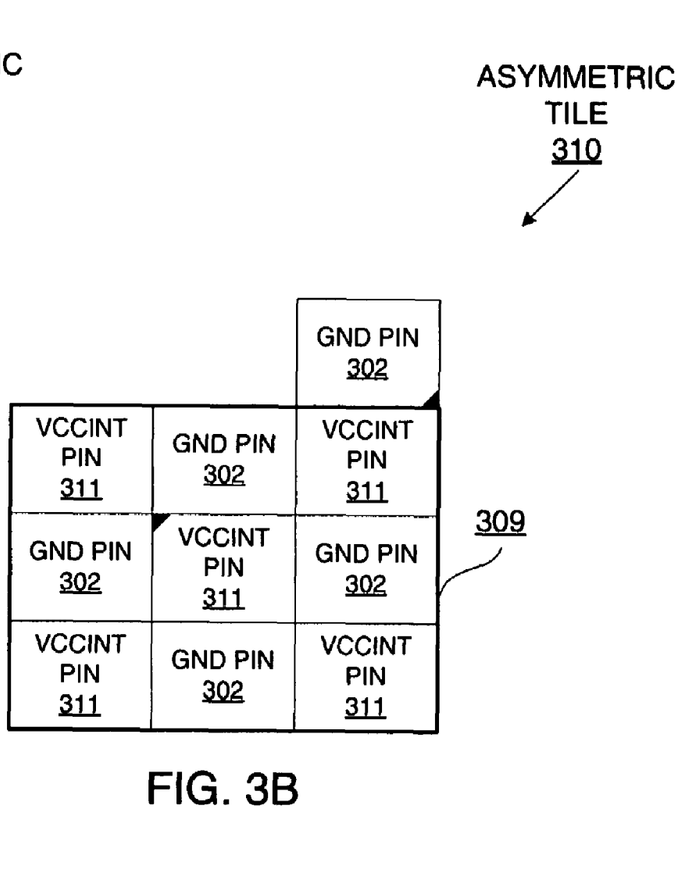
FIG. 3B is a block layout diagram depicting an alternative exemplary embodiment of a tile.

FIG. 3B is a block layout diagram depicting an alternative exemplary embodiment of a tile 310. Tile 310 may have the same orientation of pins as tile 300 of FIG. 3A. However, tile 310 may be used for forming a checkerboard, or a portion thereof, pattern with respect to power and ground. In this example, ground pins 302 are in a checkerboard arrangement with respect to Vcc internal pins 311, where an adjacent ground pin 302 on the border of the array of tile 310 is at the same location as that illustratively shown of ground pin 302 of FIG. 3A. Again, adjacent ground pin 302 may be in any of eight possible locations, as previously described.

With simultaneous reference to FIGS. 3A and 3B, tiles 300 and 310, respectively, are further described. Notably, the orientation of Vcc internal pin 311 at the center of array 309 of tile 310 is merely for purposes of illustration, and the placements of ground pins 302 and Vcc internal pins 311 may be swapped. Other details regarding tile 310 previously described with reference to tile 300 are not repeated here for purposes of clarity.

Notably, use of a checkerboard, though having a signal pin density of zero, may be used to substantially reduce mutual inductance. Thus, a portion of a pinout array may use tile 310 and another portion of the pinout array may use tile 300. Accordingly, to further differentiate tile 300 from tile 310, tile 300 may be referred to as a "sparse chevron" tile 300 and tile 310 may be referred to as a "checkerboard" tile 310 for reasons which are described below in additional detail.

Figure 4:
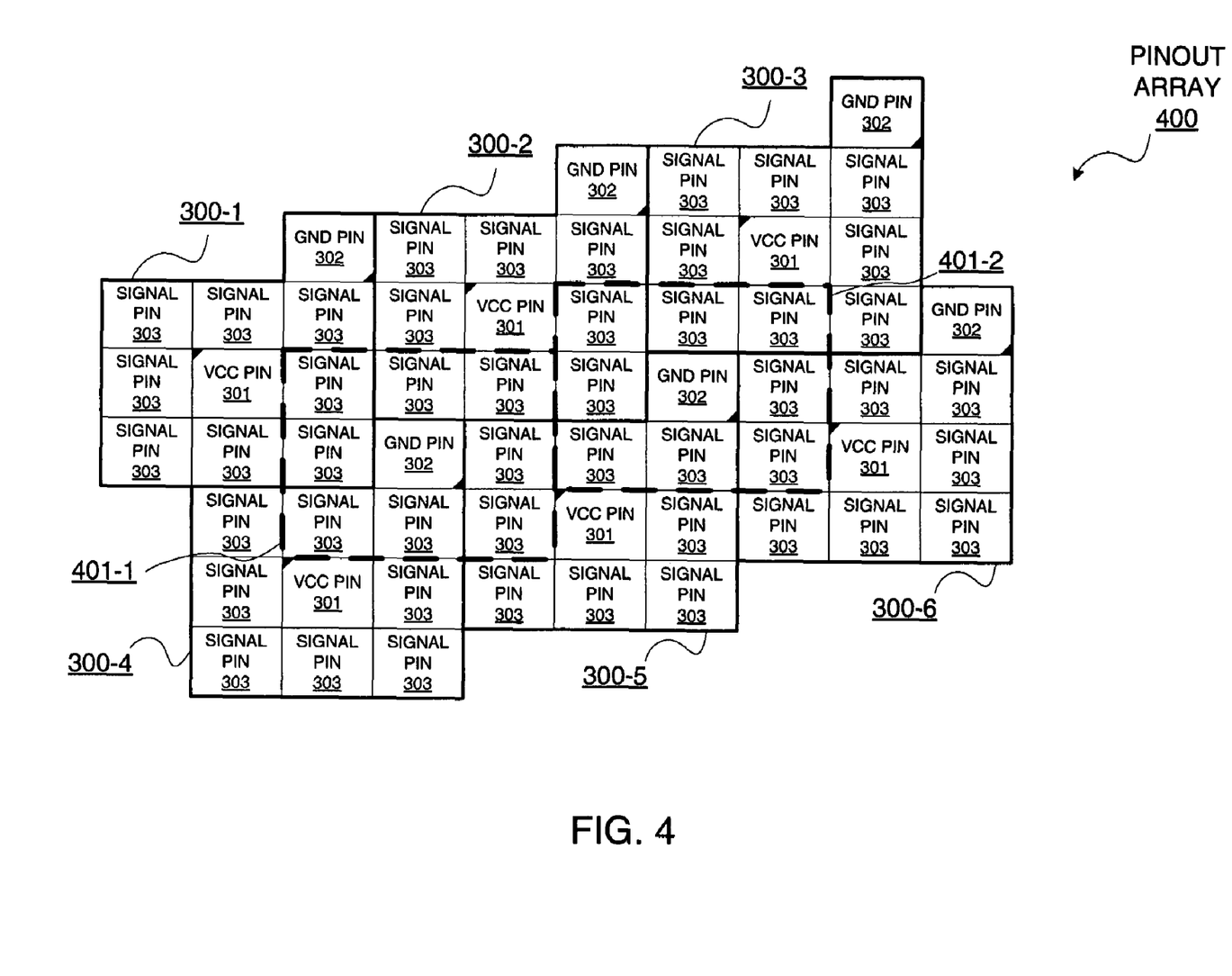
FIG. 4 is a pinout diagram depicting an exemplary embodiment of a pinout array formed using repeated application of the tile of FIG. 3A.

FIG. 4 is a pinout diagram depicting an exemplary embodiment of a pinout array 400 formed using tiles 300-1 through 300-6. Notably, pinout array 400 may be a portion of a complete pinout array for an integrated circuit. As may be understood from FIG. 4, tiles 300-1 through 300-6, which are respective tiles 300 of FIG. 3A, are interconnected in an offset pattern, where signal pins 303 form an array, such as a square or a rectangle 401-1 or 401-2, around a ground pin 302. Accordingly, it should be appreciated that tiles 300 may be used to populate a plane, such as a pinout array for an integrated circuit.

Figure 5A:
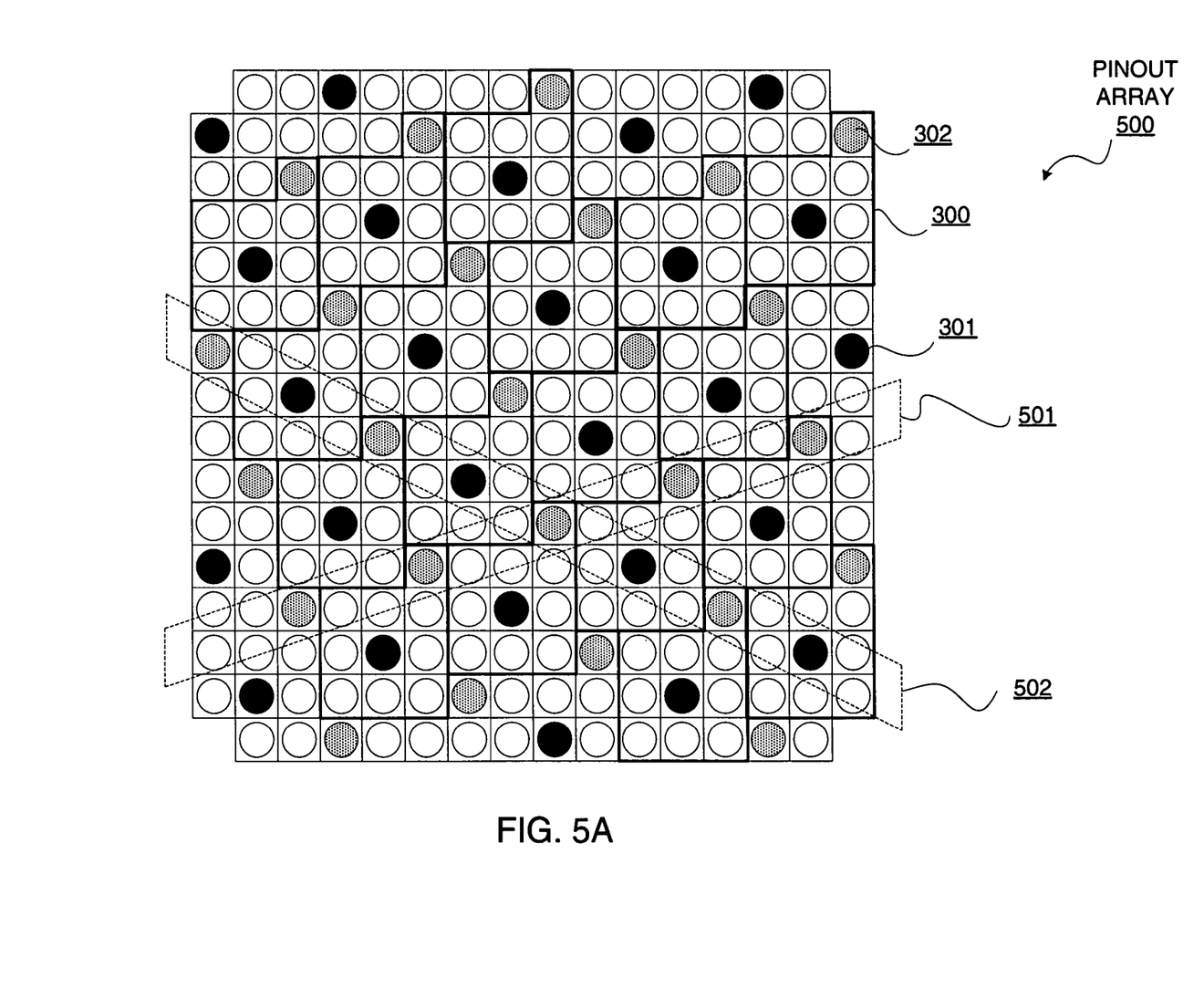
FIGS. 5A, 5B, and 5C are high-level pinout diagrams depicting respective exemplary embodiments of a pinout array using repeated application of the tile of FIG. 3A.

FIG. 5A is a high-level pinout diagram depicting an exemplary embodiment of a pinout array 500. Pinout array 500 is formed using tiles 300 as well as portions thereof to fill in boundary conditions. Thus, all of a pinout array may be populated using the pattern of tile 300. For purposes of clarity, Vcc pins and ground pins have been illustratively shown as respective black dots and stippled dots, and signal pins have been illustratively shown as white circles. Notably, not all of pinout array 500 need be populated with pins. Accordingly, a no-connect region may be part of pinout array 500 though not illustratively shown.

Figure 5B:
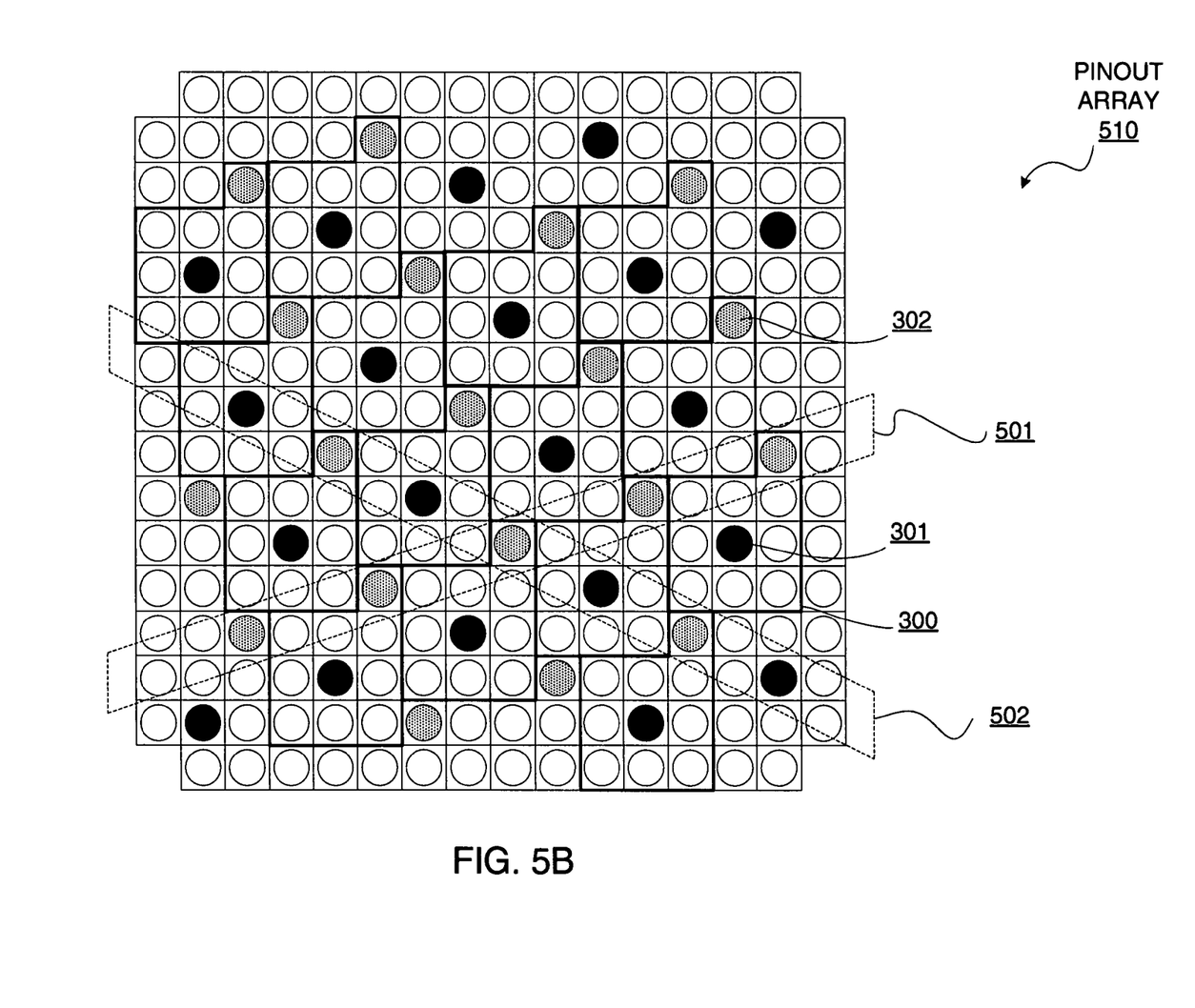

However, boundary conditions may be relaxed with respect to issues of mutual inductance by having pins along a boundary closer to a ground plane. For example, the 8:1:1 ratio may be relaxed around a boundary by coupling those outer pins to topmost rows of a PCB, such as PCB 205 of FIG. 2B, as illustratively shown in the high-level pinout diagram of FIG. 5B. In FIG. 5B, power and ground pins 301 and 302 of FIG. 5A around the outer perimeter of pinout array 500 have been removed to provide pinout array 510. In this example, power and ground pins 301 and 302 of FIG. 5A have been replaced with signal pins. As is well known, PCBs conventionally have surface traces, generally known as microstrip traces, as well as stripline traces. Stripline traces exist within the PCB between power and ground layers, whereas surface traces, as the name suggests, exist along a surface of the PCB. Thus, by using the surface traces of the PCB for boundary signals, the 8:1:1 ratio may be relaxed while not going above a worst-case mutual inductance. It should be understood that when laying out a pinout array, the 8:1:1 ratio may be generally used to reduce or maintain mutual inductance below or at a worst case or threshold level subject to pin location among other considerations.

With renewed reference to FIG. 5A, it should be appreciated that ground pins 302 form a diagonal 501, where a ground pin 302 is three pins laterally and one pin vertically away from another ground pin 302 of such diagonal 501. Power pins 301 and ground pins 302 alternate to form a diagonal 502 where each power or ground pin is disposed away from an adjacent ground or power pin, respectively, of such diagonal 502 by two pins laterally and one pin vertically. Thus, by way of understanding from a geometric perspective, intersecting diagonals 501 and 502 generally form a sparse chevron pattern. Notably, although only one each of diagonals 501 and 502 are illustratively shown in FIG. 5A, for purposes of clarity by way of example and not limitation, numerous diagonals 501 and 502 may exist in pinout array 500.

Figure 5C:
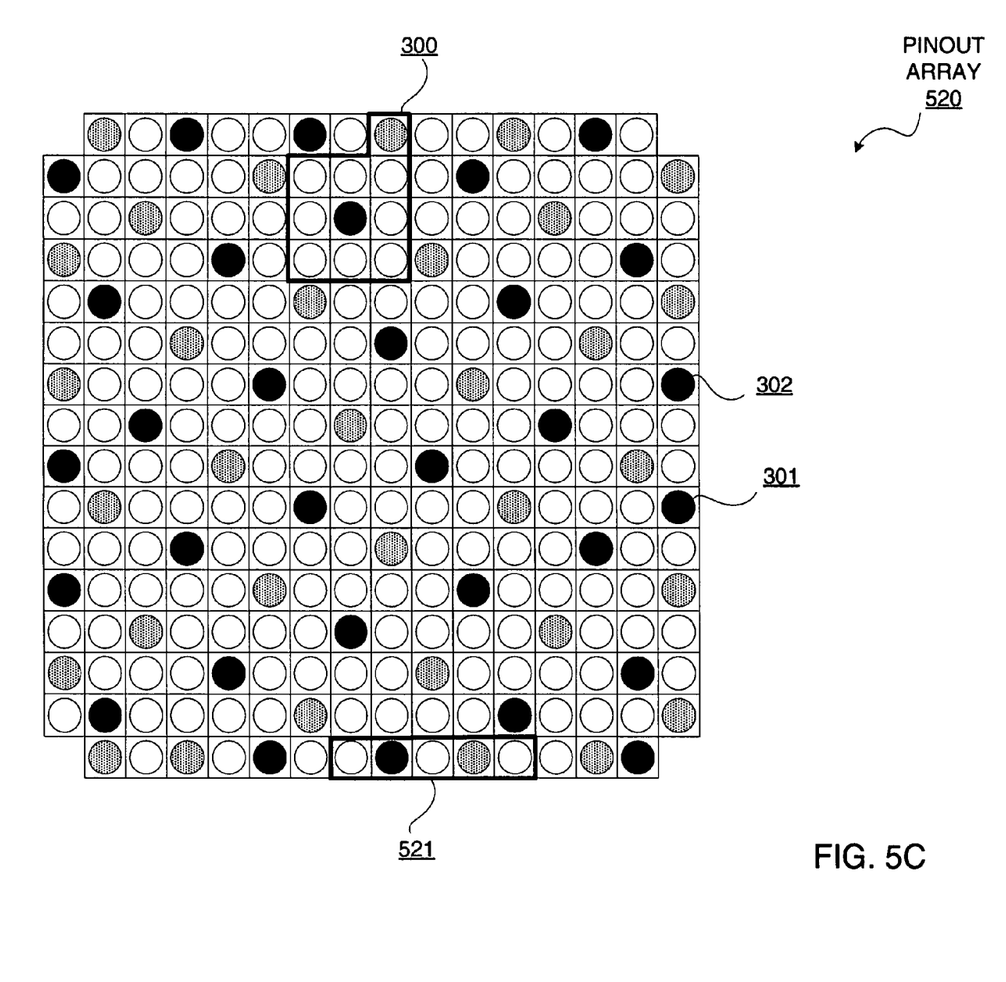

Alternatively, additional power and ground pins 301 and 302 of FIG. 5A may be added around the outer perimeter of pinout array 500 to provide pinout array 520 of FIG. 5C. In the example of the high-level pinout diagram of FIG. 5C, signal pins of pinout array 500 have been replaced with power and ground pins 301 and 302. In this example, a 3:1:1 pattern 521 is used to tile at least a portion of a perimeter of pinout array 520. Additional power and ground pins may be used in the perimeter to ensure that each signal pin is at least one pin away from both a power pin and a ground pin.

With reference to FIGS. 5A, 5B, and 5C, it should be understood that for boundary or other conditions, the 8:1:1 ratio may be relaxed such that the number of signal pins is greater than eight for each nearest neighbor power and ground pin to provided increased signal density with respect to power and ground interconnects. Moreover, it should be understood that for boundary or other conditions, the 8:1:1 ratio may be contracted such that the number of signal pins is less than eight for each nearest neighbor power and ground pin to provide decreased signal density with respect to power and ground interconnects. Lastly, it should be understood that for boundary or other conditions, the 8:1:1 ratio may be maintained or altered by truncating tiles.

Figure 6:
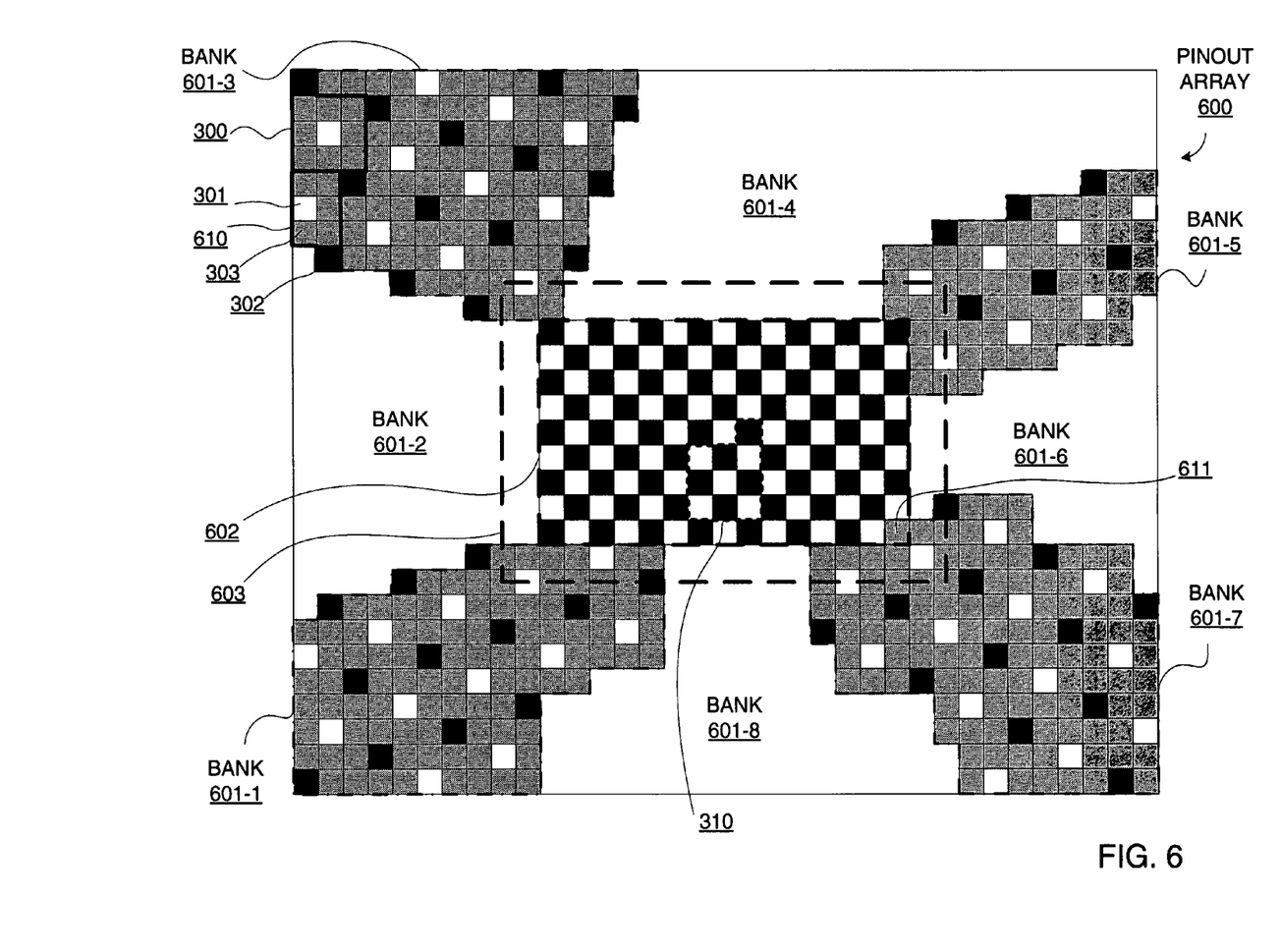
FIG. 6 is a pinout diagram depicting an exemplary embodiment of a pinout array using the repeated application of the tiles of FIGS. 3A and 3B.

FIG. 6 is a pinout diagram depicting an exemplary embodiment of a pinout array 600. Pinout array 600 includes banks 601-1 through 601-8. Banks 601-1, 601-3, 601-5, and 601-7 are illustratively shown with pins in the form of gray boxes to indicate signal pins, white boxes to indicate Vcc pins, and black boxes to indicate ground pins. Pins of banks 601-2, 601-4, 601-6, and 601-8 are not illustratively shown for purposes of clarity, though such banks may be tiled using tile 300 of FIG. 3A as illustratively shown with respect to banks 601-1, 601-3, 601-5, and 601-7.

Each of banks 601-1 through 601-8 may be tiled using tiles 300. With reference to bank 601-3 for purposes of clarity by way of a reference example, bank 601-3 is laid out using tiles 300, as well as the pattern of tiles 300 along the boundary of pinout array 600. Bank 601-3 employs tiles in a variety of orientations. In other words, tile 300 may be rotated to address boundary conditions while maintaining the pattern of tile 300. For example, a portion 610 of a tile 300 is flipped vertically in comparison to the tile 300 located directly above it in order to fit along a boundary edge of pinout array 600.

Boundary conditions may arise where one bank, such as bank 601-3, intersects a different pinout pattern, such as checkerboard pattern 602. As previously mentioned, a checkerboard pattern, though lacking in signal density, facilitates a very low mutual inductance. Checkerboard 602 may be formed of Vcc internal and ground pins, as previously described, and may be tiled, at least in part, using tile 310. Notably, checkerboard pattern 602 need not be a complete checkerboard, as illustratively shown, with a signal pin 611 disposed within checkerboard pattern 602. Checkerboard pattern 602 may be advantageous for a package, such as package 203 of FIG. 2B, where an integrated circuit, such as IC 201, is coupled to such package, generally over checkerboard pattern 602. Dashed line 603 shows an example of where an integrated circuit die may be located relative to checkerboard pattern 602.

At this point, it should be understood that there are at least two variations of a pinout array using tiles 300. Namely, in an embodiment, all of such a pinout array may be formed in accordance with the pattern of tile 300. In another embodiment, a portion of the pinout array may be formed using the pattern of tile 300, while higher density signaling may be provided around the boundaries of such a pinout array, though in violation of the pattern of tile 300. In the latter configuration, mutual inductance of boundary signal pins may be controlled by using PCB surface traces for coupling those boundary pins.

Notably, though the pattern of tile 300 is followed along the outer boundary of pinout array 600, such pattern need not be followed, as previously described, while maintaining or being below a threshold level of mutual inductance. Moreover, all power and ground pins may be removed from such outer boundaries, using surface traces for signal pins as previously described. Again, a checkerboard pattern 602 may be used to reduce impedance, and in particular inductance, along paths from an integrated circuit die to a printed circuit board, such as PCB 205 of FIG. 2B, where such paths are disposed under such die. In other words, a checkerboard pattern 602 may be used to increase conductance, especially for high frequencies, between a PCB and an integrated circuit die.

So, for example, an 8:1:1 ratio may be maintained for pins internal to pinout array 600, except for a checkerboard pattern area and boundary pins of pinout array 600. Pinout array 600 may be formed of both the pattern of tile 300 as well as checkerboard pattern 602. Moreover, checkerboard pattern 602 may be at least partially tiled using tile 310. Thus, pinout array 600 may be a hybrid of tiles, as well as a hybrid of pinout patterns.

Figure 7:
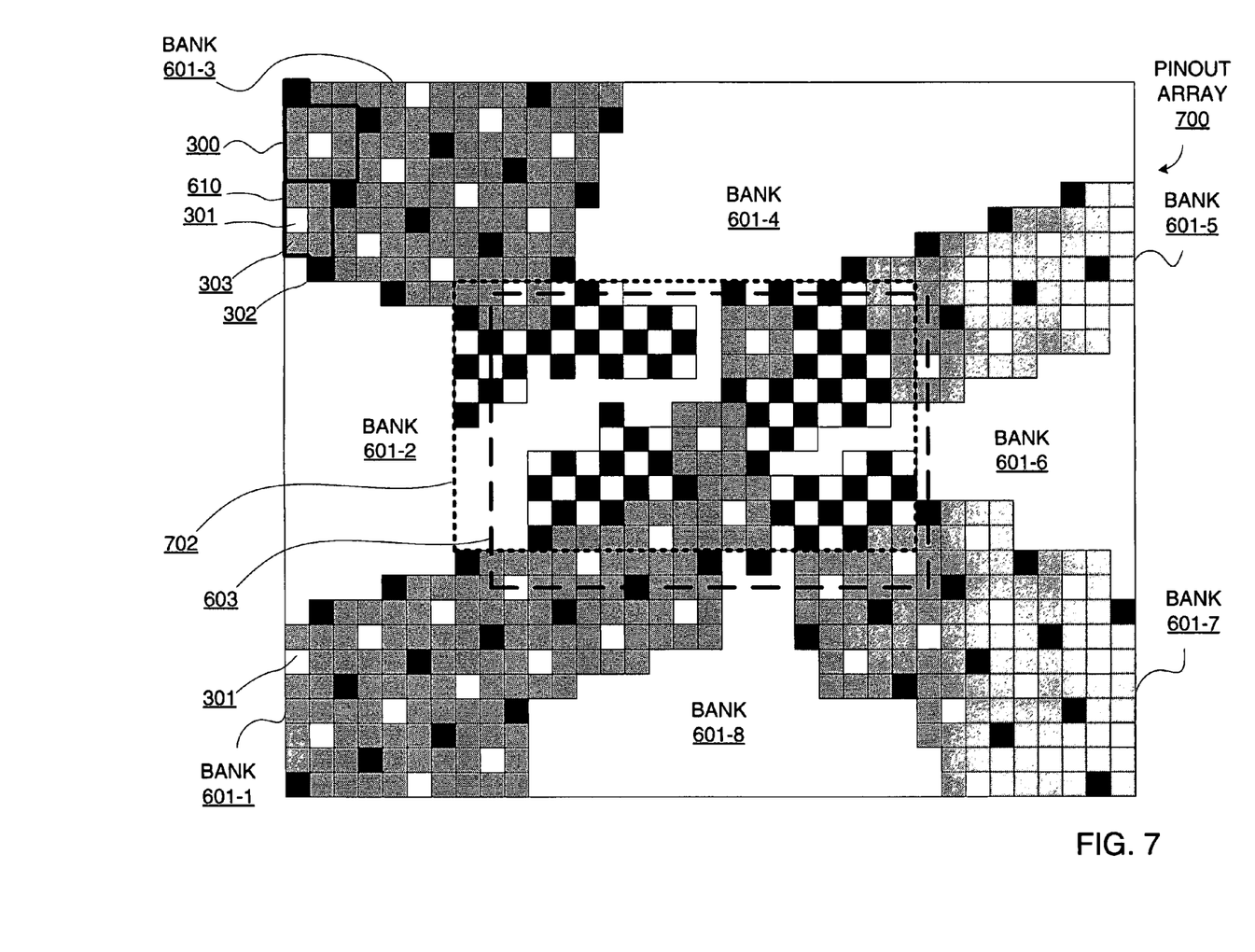
FIG. 7 is a pinout diagram depicting an exemplary embodiment of a pinout array using repeated application of the tiles of FIGS. 3A and 3B.

FIG. 7 is a pinout diagram depicting an exemplary embodiment of a pinout array 700. In this embodiment, checkerboard tiles 310 and sparse chevron tiles 300 are intermixed within an area 603, namely the area under an integrated circuit die. A partial checkerboard pattern 702 may be created by the intermingling of tiles 300 and 310, where some signaling under an integrated circuit die may be employed.

Furthermore, partial checkerboard pattern 702 may be formed such that there is no disruption in the general tile pattern of ten pins at the intersection of a bank to partial checkerboard pattern 702. Thus, for example, a bank may extend into area 603, and ground pins in this example of tiles 300 may be used to tile such a bank. Additionally, some of such ground pins may also be used as part of checkerboard tiling of partial checkerboard pattern 702. Moreover, with renewed reference to FIG. 6, ground pins of tiles 300 may be used to form part of checkerboard pattern 602.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for providing an interconnect array pattern, comprising:

obtaining an interconnect pattern, the interconnect pattern having at least ten interconnect locations, one of the at least ten interconnect locations being for a power interconnect, another one of the at least ten interconnect locations being for a ground interconnect, and at least eight remaining interconnect locations of the at least ten interconnect locations being for additional interconnects to provide at least eight additional interconnect locations for signals and not being for either power or ground, one of either the ground interconnect or the power interconnect being located in a medial region of the interconnect pattern;

a first two of the at least eight additional interconnect locations located horizontally adjacent to the medial region, one of the first two being located on a right side of the medial region, another one of the first two being located on a left side of the medial region;

a second two of the at least eight additional interconnect locations located vertically adjacent to the medial region, one of the second two being located on a top side of the medial region, another one of the second two being located on a bottom side of the medial region;

an offset region of the at least ten interconnect locations located diagonally adjacent to one of either the first two or the second two of the at least eight additional interconnect locations, the offset region being external to a perimeter defined by the at least eight additional interconnect locations;

the one of either the power interconnect or the ground interconnect that is not located in the medial region being located in the offset region; and repeatedly applying the interconnect pattern to provide at least a portion of the interconnect array pattern.

2. The method according to claim 1, further comprising:

a third two of the at least eight additional interconnect locations located diagonally adjacent to and above the medial region;

a fourth two of the at least eight additional interconnect locations located diagonally adjacent to and below the medial region;

the first two of the at least eight additional interconnect locations located between the third two and the fourth two of the at least eight additional interconnect locations;

one of the second two of the at least eight additional interconnect locations located between the third two of the at least eight additional interconnect locations;

another one of the second two of the at least eight additional interconnect locations located between the fourth two of the at least eight additional interconnect locations; and wherein at least a portion of the interconnect array pattern has at least an eight-to-one-to-one signal-to-power-to-ground ratio responsive to repeated application of the interconnect pattern, and wherein the repeatedly applying of the interconnect pattern provides interconnect patterns offset from one another responsive to the offset region.

3. The method according to claim 1, wherein the interconnect array pattern is for interconnecting an integrated circuit package to a printed circuit board, and wherein the interconnect pattern includes the power interconnect surrounded by the additional interconnects and the ground interconnect adjacent to a corner of the additional interconnects surrounding the power interconnect.

4. The method according to claim 1, wherein the interconnect array pattern is for interconnecting printed circuit boards.

5. The method according to claim 1, wherein the interconnect array pattern is for interconnecting a line card to a backplane.

6. The method according to claim 1, wherein the interconnect array pattern is for interconnecting an integrated circuit die to an integrated circuit package.

7. The method according to claim 1, further comprising:

truncating the interconnect pattern by not including at least one of the power interconnect or the ground interconnect of the interconnect Pattern; and applying the truncated interconnect pattern to provide part of the interconnect array.

8. The method according to claim 1, further comprising:

relaxing the interconnect pattern from an eight-to-one-to-one signal-to-power-to-ground ratio to increase signal density relative to the power interconnect and the ground interconnect; and applying the interconnect pattern relaxed to provide part of the interconnect array.

9. The method according to claim 1, further comprising:

contracting the interconnect pattern from an eight-to-one-to-one signal-to-power-to-ground ratio to decrease signal density relative to the power interconnect and the ground interconnect; and applying the interconnect pattern contracted to provide part of the interconnect array.

* * * * *